(12) United States Patent
Williams (10) Patent No.: US 7,977,949 B2
(45) Date of Patent: Jul. 12, 2011

(54) LOOP RESISTANCE TESTER CONTROL SYSTEM

(75) Inventor: Matthew Jason Williams, Bremerton, WA (US)

(73) Assignee: The Boeing Company, Chicago, IL (US)

( * ) Notice: Subject to any disclaimer, the term of this patent is extended or adjusted under 35 U.S.C. 154(b) by 553 days.

(21) Appl. No.: 12/197,158

(22) Filed: Aug. 22, 2008

(65) Prior Publication Data

US 2010/0045303 A1 Feb. 25, 2010

(51) Int. Cl.
*G01R 31/08* (2006.01)
*G01R 31/02* (2006.01)
*H04B 3/46* (2006.01)

(52) U.S. Cl. ............. 324/525; 324/543; 324/551

(58) Field of Classification Search .......... 324/543, 324/537, 500, 525, 529, 549, 502, 523, 527, 324/127, 126, 76.11
See application file for complete search history.

(56) References Cited

U.S. PATENT DOCUMENTS

| | | | | |
|---|---|---|---|---|
| 4,808,911 A | * | 2/1989 | Oaks | 324/715 |
| 5,378,992 A | | 1/1995 | Murphy | |
| 6,181,140 B1 | * | 1/2001 | Vokey et al. | 324/523 |
| 6,201,853 B1 | | 3/2001 | Butler et al. | |
| 6,211,682 B1 | * | 4/2001 | Liu | 324/502 |
| 6,225,810 B1 | * | 5/2001 | Godo et al. | 324/525 |
| 6,288,553 B1 | * | 9/2001 | Hofstetter et al. | 324/525 |

* cited by examiner

*Primary Examiner* — Hoai-An D Nguyen
(74) *Attorney, Agent, or Firm* — Yee & Associates, P.C.

(57) ABSTRACT

A method is present for remotely controlling, monitoring, and analyzing loop resistance in a vehicle. A loop resistance test unit is positioned in the vehicle. A set of commands is sent from a monitoring unit to the loop resistance test unit over a wireless communications interface. Measurements are generated with the loop resistance test unit in response to the set of commands. The measurements are received from the loop resistance test unit at the monitoring unit in response to the set of commands send over the wireless communications interface.

20 Claims, 6 Drawing Sheets

LOOP RESISTANCE TESTER CONTROL SYSTEM

BACKGROUND INFORMATION

1. Field

The present disclosure relates generally to testing equipment and in particular, to a method and apparatus for testing loop resistance in a vehicle. Still more particularly, the present disclosure relates to a method, apparatus, and computer program product for controlling a loop resistance tester, performing analysis of measured data, and integrating with data management tool/database.

2. Background

In aircraft, cable shielding is a component used for protecting various aircraft systems from electrical effects, such as lightning strikes, high intensity radiated fields, and other environmental conditions. Testing the cable shields and joints in aircraft systems may be performed using a loop resistance tester. A cable shield is the material that covers a number of wires in a cable. A cable shield may provide the wire protection from physical contact and/or from interference caused by electromagnetic fields or signals. A joint is a connection where a cable may be connected to another cable and/or device. A loop resistance tester is an electronic instrument or device for measuring the resistance of cable shielding and joints. A loop resistance tester may test this resistance cable shielding and impedance in joints as installed in aircraft in a manner that does not require the cables to be disconnected.

Typically, a loop resistance tester contains couplers, joint probes, and an instrument assembly. The couplers are used to measure the loop resistance formed by the shielding in the cable under test and the aircraft structure. The joint probes are used to measure the resistance of joints in the cable to ensure measured values are within designed tolerance and to compare the sum of joint impedances to the loop measurement, which includes all of the individual joints within the loop.

Maintenance personnel may test the cable shields and joints in various aircraft wire bundles. This type of testing may be performed on an aircraft that contains fuel and is totally non-intrusive when making these types of measurements.

Loop resistance testing of the shielding and the joints may be performed with the cable still installed. Loop resistance may be measured for a cable as well as a joint across which a connection may be made.

Presently, measurements of loop resistance involve a maintenance person placing the probes and couplers to cables and/or joints in selected locations of the aircraft. Thereafter, the maintenance person manipulates controls on a loop resistance tester to obtain measurements. These measurements are either written down or relayed via a radio or other communications device to another maintenance person for analysis. These types of interactions may be time-consuming and costly during maintenance operations.

Therefore, it would be advantageous to have a method and apparatus to overcome the problems described above.

SUMMARY

In one advantageous embodiment, a method is present for remotely monitoring loop resistance in a structure. A loop resistance test unit is positioned in the structure. A set of commands is sent from a monitoring unit to the loop resistance test unit over a wireless communications interface. Measurements are generated with the loop resistance test unit in response to the set of commands. The measurements are received from the loop resistance test unit at the monitoring unit in response to the set of commands sent over the wireless communications interface.

In another advantageous embodiment, an apparatus comprises a loop resistance test unit and a monitoring unit. The loop resistance test unit has a first wireless communications unit, wherein the loop resistance test unit is capable of receiving a number of commands over the first wireless communications unit, executing a number of tests using the set of commands, generating measurements from executing the set of tests, and sending the measurements using the first wireless communications unit. The monitoring unit has a second wireless communications unit, wherein the monitoring unit is capable of generating the set of commands in response to a user input, sending the set of commands to the loop resistance test unit over the second wireless communications unit, and receiving the measurements sent by the first wireless communications over the second communications unit.

In still another advantageous embodiment, a computer program product is present for loop resistance testing. The computer program product comprises a computer readable storage medium and program code stored on the computer readable storage medium. Program code is present for generating a number of commands to cause a loop resistance test unit to perform a number of tests. Program code also is present for sending the set of commands to the loop resistance test unit over a wireless interface. Program code is present for receiving measurements sent by the loop resistance test unit from performing the set of tests, wherein the measurements are received over the wireless interface.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
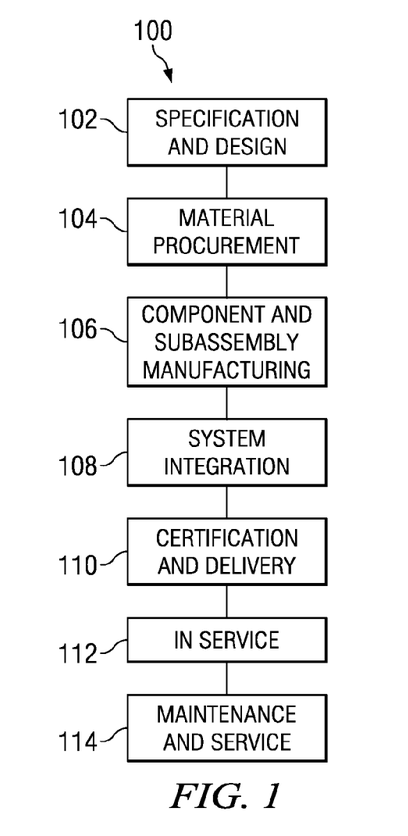
FIG. 1 is a diagram illustrating an aircraft manufacturing and service method in which an advantageous embodiment may be implemented.
Figure 2:
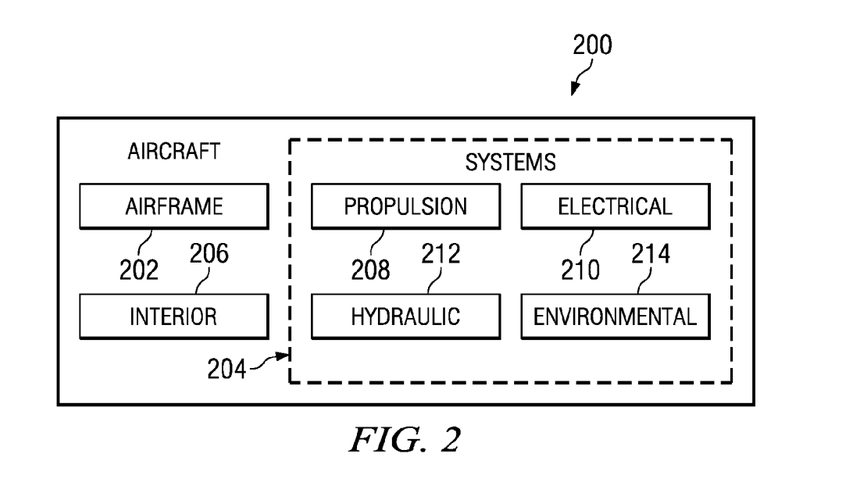
FIG. 2 is a diagram of an aircraft in accordance with an advantageous embodiment.

Referring more particularly to the drawings, embodiments of the disclosure may be described in the context of the aircraft manufacturing and service method 100 as shown in FIG. 1 and aircraft 200 as shown in FIG. 2. Turning first to FIG. 1, a diagram illustrating an aircraft manufacturing and service method is depicted in accordance with an advantageous embodiment. During pre-production, exemplary aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, a diagram of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, and environmental system 214. Any number of other systems may be included. Although an aerospace example is shown, different advantageous embodiments may be applied to other industries, such as, for example, the automotive industry, where highly electrically conductive bonds must be verified.

Apparatus and methods embodied herein may be employed during any one or more of the stages of aircraft manufacturing and service method 100 in FIG. 1. For example, components or subassemblies produced in component and subassembly manufacturing 106 in FIG. 1 may be fabricated or manufactured in a manner similar to components or subassemblies produced while aircraft 200 is in service 112 in FIG. 1.

Also, one or more apparatus embodiments, method embodiments, or a combination thereof may be utilized during production stages, such as, for example, without limitation, component and subassembly manufacturing 106 and system integration 108 in FIG. 1, by substantially expediting the assembly of or reducing the cost of aircraft 200. Similarly, one or more of apparatus embodiments, method embodiments, or a combination thereof may be utilized while aircraft 200 is in service 112 or during maintenance and service 114 in FIG. 1.

The different advantageous embodiments may be implemented in system integration 108 and/or maintenance and service 114 to test the resistance or impedance of various components in an aircraft. The different advantageous embodiments recognize and take into account that the interaction that a maintenance person has with test equipment may increase the time and expense for performing maintenance on an aircraft.

The different advantageous embodiments provide a computer implemented method, apparatus, and computer program code for remotely monitoring loop resistance in a vehicle or other structure. A loop resistance testing system may be positioned in a vehicle. A set of commands are sent from a monitoring unit to the loop resistance testing system over a wireless communications interface. Measurements are generated with a loop resistance testing system in response to the commands. Measurements are received from the loop resistance testing system at the monitoring unit. These measurements may then be analyzed.

With use of a monitoring unit, the different tests performed on a cable and/or joint may be controlled and set remotely in accordance with an advantageous embodiment. Further, the measurements may be streamed from the loop resistance testing system to the monitoring unit, avoiding having to write down or verbally relay measurements as currently done. This information may then be analyzed or relayed for analysis, and maintenance operations may be identified based on the analysis.

A remote graphical user interface feature allows a unit operator to view and/or control a test unit over a computer network, thus allowing an operator to view and/or control a test unit across any geography with supporting telecommunications and/or computer infrastructure.

These different operations are computer implemented processes. A computer implemented process is a number of operations that may be performed by a computer or other device containing a processor capable of executing program code. As used herein, the term "a number of" when referring to an item means one or more items. For example, a number of operations is one or more operations. In this manner, an operator or technician is no longer required to interact with the test unit except for placement of measurement probes. In the different advantageous embodiments, the test may be performed by another operator at a remote location from where the testing in being performed.

For example, the technician at the location being tested does not need to switch between test modes, make measurements, make interpretations of measurements, or report information for different measurement periods. Instead, the remote user interface allows another operator to view and/or control the test unit. The communications to view and/or control the test unit may be made over a computer network, wireless communications link, or some other suitable communications mechanism. In this type of implementation, the operator at the remote location may be located at some other geographic location.

For example, the technician may place the measurement probes within an aircraft. Another operator may be located elsewhere in the building, in another building, in a different city, or even on a different continent. This other operator may receive data as tests are being performed without requiring assistance from the technician at the test site.

Figure 3:
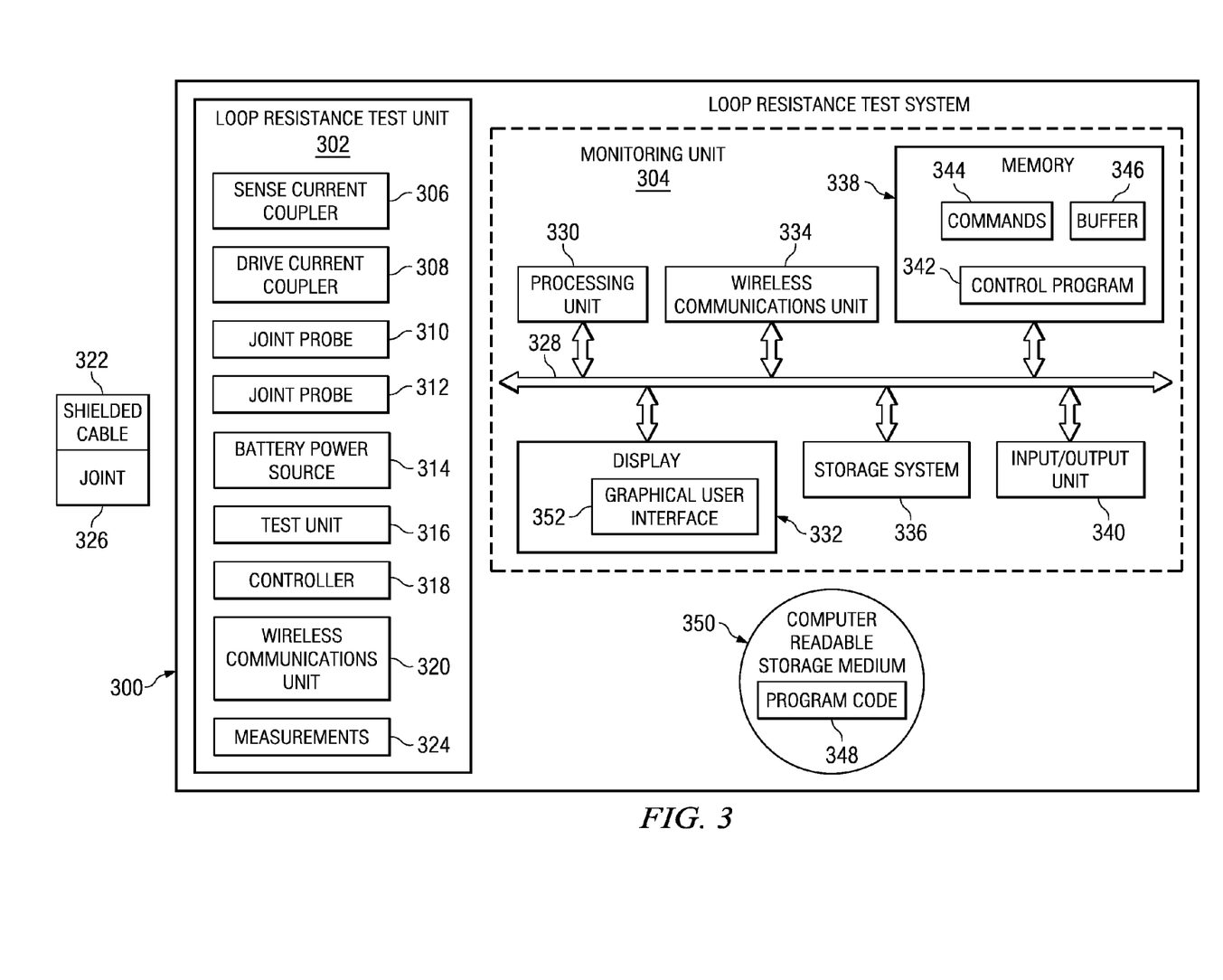
FIG. 3 is a diagram illustrating a loop resistance test system in accordance with an advantageous embodiment.

With reference now to FIG. 3, a diagram illustrating a loop resistance test system is depicted in accordance with an advantageous embodiment. Loop resistance test system 300 is an example of a test system that may be used to perform loop resistance tests on various cables and joints within electrical system 210 of aircraft 200. In this example, loop resistance test system 300 includes loop resistance test unit 302 and monitoring unit 304.

Loop resistance test unit 302 includes sense current coupler 306, drive current coupler 308, joint probe 310, joint probe 312, battery power source 314, test unit 316, controller 318, and wireless communications unit 320. Test unit 316 makes two types of measurements in these illustrative examples. Test unit 316 measures the loop resistance when in a loop mode. Test unit 316 measures joint impedance when in a joint mode.

Sense current coupler 306 may be connected to shielded cable 322 in one location and drive current coupler 308 may be connected to shielded cable 322 in another location. Test unit 316 may send current across shielded cable 322 from drive current coupler 308 to sense current coupler 306.

Test unit 316 inductively applies a known current to a point at shielded cable 322 where drive current coupler 308 is connected to shielded cable 322. In other words, by driving a current through drive current coupler 308, test unit 316 is able to induce or produce a current onto shielded cable 322. This current travels through shielded cable 322 to the point at which sense current coupler 306 is connected to shielded cable 322. Sense current coupler 306 measures the current applied to shielded cable 322. Test unit 316 may generate resistance measurements from these couplers that are placed in measurements 324. Measurements 324 may be used to determine if the shielding in shielded cable 322 meets a requirement of a policy without having to disconnect shielded cable 322.

Further, test unit 316 also may generate impedance measurements for joint 326 using joint probe 310 and joint probe 312. Joint probe 310 may be placed at one location on joint 326 while joint probe 312 may be placed at another location on joint 326. These joint probes may be connected, while sense current coupler 306 and drive current coupler 308 are attached to shielded cable 322. Drive current coupler 308 transformer couples the drive current onto the bundle. The resulting voltage across a joint is measured, by which a resistance value is then derived as R=V/I, in which R is the resistance value, V is the voltage, and I is the current.

Test unit 316 measures the voltage across a joint and the loop current using joint probes 310 and 312. Measurements 324 are made using joint probes 310 and 312 while current is being sent from drive current coupler 308 through shielded cable 322 or other conductive elements, such as, for example, ground straps.

Measurements 324 made using joint probes 310 and 312 may be used to obtain impedance in joint 326. By measuring the joints in a loop, a bad joint connection may be identified without having to remove a cable. In other words, if joint 326 has a faulty or out of tolerance connection, this faulty connection may be identified without having to remove shielded cable 322.

In one advantageous embodiment, a loop mode measurement may be performed prior to a joint mode measurement. After a loop value has been measured, a joint mode may be selected with sense current coupler 306 and drive current coupler 308 remaining attached to the cable and continuing to induce current onto the device being tested. In this mode, joint probe 310 joint probe 312 may function as voltage probes. A measurement of voltage is made across the probes and divided by the induced current to obtain a resistance value.

Controller 318 may be used to control test unit 316 based on commands received through wireless communications unit 320. In these examples, commands may be received from monitoring unit 304. Further, controller 318 may send measurements 324 to monitoring unit 304 over wireless communications unit 320. Wireless communications unit 320 may be, for example, a wireless transceiver, a wireless network card, a wireless RS-232 link, or some other suitable wireless device. In this example, measurements 324 are not stored local to controller 318; however, in other examples, measurements 324 may be stored local to controller 318. In addition, measurements 324 are then analyzed in monitoring unit 304 and are only stored or made ready for transmission if determined to be valid data.

In these different advantageous embodiments, loop resistance test unit 302 may be implemented in part using a loop resistance tester available from the Boeing Company. In these advantageous embodiments, loop resistance test unit 302 may be modified or augmented to include controller 318 and wireless communications unit 320. These components may be implemented within loop resistance test unit 302 in these examples. In other advantageous embodiments, these components may be connected to loop resistance test unit 302 through a communications board such as a universal serial bus or other suitable communications port.

Monitoring unit 304 may be implemented using a data processing system or other computing device. In this example, monitoring unit 304 includes bus 328, which provides connections to a number of different components. These components include, for example, processing unit 330, display 332, wireless communications unit 334, storage system 336, memory 338 and input/output unit 340.

Processing unit 330 executes instructions for software such as, for example, control program 342 loaded into memory 338. Processing unit 330 may be a number of one or more processors or may be a multi-core processor depending on the particular implementation. Further, processing unit 330 may be implemented using one or more heterogeneous processor systems in which a main processor is present with secondary processors on a single chip.

Memory 338 and storage system 336 are examples of storage devices that may store program code, data, commands, and other information. A storage device is any piece of hardware that is capable of storing information either on a temporary basis and/or a permanent basis. Memory 338 in these examples may be, for example, a random access memory or any other suitable volatile or non-volatile storage device.

Storage system 336 may take various forms depending on the particular implementation. For example, storage system 336 may contain one or more components or devices. For example, storage system 336 may be a hard disk drive, a flash memory, a rewritable optical disk drive, a rewriteable magnetic tape drive, a thumb drive, or some combination of the above. The storage media used by storage system 336 may be removable depending upon the particular implementation. The storage unit may be any accessible computer server and/or storage unit.

Wireless communications unit 334 provides for communications with loop resistance test unit 302 over a wireless medium in these examples. In these examples, the wireless medium is air. Of course, in other implementations, this wireless transmission may occur over other media, such as, for example, water or a vacuum. Wireless communications unit 334 may send commands 344 to wireless communications unit 320 for use by controller 318 to control test unit 316 in performing tests and various other operations.

Further, wireless communications unit 334 may receive measurements 324 from loop resistance test unit 302 for analysis. Of course, in other advantageous embodiments, a wired connection may be present between loop resistance test unit 302 and monitoring unit 304. For example, a network cable or universal serial bus cable may be used depending on the particular implementation. In this manner, information may be exchanged between loop resistance test unit 302 and monitoring unit 304 through both physical and wireless communications links.

Input/output unit 340 allows for input and output of data with other devices. For example, input/output unit 340 may provide a connection for user input through a keyboard and/or mouse. Additionally, input/output unit 340 may send output to a printer. Display 322 provides a display to present information to a user.

Instructions for the operating system, applications, programs, or other software may be located on storage system 336. The processes of the different advantageous embodiments may be performed by processing unit 330 using computer implemented instructions or program code which may be located in memory 338. In these examples, this program code may be control program 342. Program code may be transferred to monitoring unit 304 to provide monitoring unit 304 the different capabilities of the different advantageous embodiments. For example, program code 348 may be located on computer readable storage medium 350 and transferred to storage system 336 and/or memory 338 for execution.

In these examples, computer readable storage medium 350 may be selectively removable and may be loaded onto or transferred to monitoring unit 304. In some advantageous embodiments, compute readable storage medium 350 may be, for example, an optical disk or a magnetic disk that is inserted or placed into a drive within storage system 336 for transfer onto a hard drive within storage system 336.

Further, computer readable storage medium 350 may be, for example, a hard disk drive located on a remote data processing system. With this type of implementation, program code 348 may be transferred to storage system 336 and/or memory 338 through a communications link.

Processing unit 330 executes control program 342 to generate various commands such as commands 344. Commands 344 may be a number of commands containing one or more commands. Commands 344 are sent to test unit 316 in loop resistance test unit 302 using wireless communications unit 320 and wireless communications unit 334. In this manner, an operator at monitoring unit 304 may remotely control and generate measurements 324. Further, an operator at monitoring unit 304 may set various parameters for test unit 316 that may be controlled using graphical user interface 352 presented on display 332. A user may interact with graphical user interface 352 through various input/output devices that may be connected to input/output unit 340.

With the use of control program 342, commands 344 may be sent to test unit 316 to obtain access to information that is normally not possible to obtain by a user. This information may not be available because currently available loop resistance test units are not capable of displaying large quantities of measurement data on the small LED segment displays currently used.

Measurements 324 may include information that is not currently available for presentation or display to a user. For example, without limitation, various flags, warnings, and/or indications generated within test unit 316 may be placed into measurements 324 for transfer to monitoring unit 304 for display and/or analysis.

In this example, these flags, warnings, and/or indications may be displayed to the user through specific graphical indicators such as, for example, LED's that turn red when an error has been detected and green when no error has been detected. Measurements 324 also include both voltage and current values.

Upon transfer to monitoring unit 304, measurements 324 are displayed on the graphical user interface. Measurements 324 are then analyzed and processed by processing unit 330 to determine whether measurements 324 are valid data. If measurements 324 are determined to be valid data, measurements 324 are then stored in a buffer, such as buffer 346. Only measurements determined to be valid may be stored in buffer 346. Measurements 324 stored in buffer 346 may then be later exported. For example, measurements 324 may be exported to a data structure, such as, for example, a database, an ACCESS database, an EXCEL spreadsheet, or some other suitable data structure. In this example, only measurements 324 determined to be valid are exported to a data structure; however, in other advantageous embodiments, the user may wish to export both valid and anomalous data for statistical purposes.

In these and other advantageous embodiments, the statistical assessment tools needed for analyzing such data may be components of the control program. Also, in this example, the exporting or mapping of the measurements to a data structure may be performed by the user using the graphical user interface. These actions may include, for example, without limitation, clicking on a specific control button. In other advantageous embodiments, other methods may be used for this process.

The illustration of the different components for loop resistance test system 300 in FIG. 3 is not intended to imply architectural or physical limitations to the manner in which different advantageous embodiments may be implemented. The different components illustrated in FIG. 3 are functional components provided for purposes of illustrating different functions and features for different advantageous embodiments.

For example, loop resistance test unit 302 may be implemented using any available loop resistance test unit. For example a Boeing 906-10247-2 Loop Resistance Tester may be used to implement loop resistance test unit 302 with modifications. This type of unit may be modified to include wireless communications unit 320 and controller 318. Controller 318 generates commands that may be generated by a user manipulating physical controls at loop resistance test unit 302, in addition to other commands that may be used in different advantageous embodiments. In this manner monitoring unit 304 is able to control tests performed by loop resistance test unit 302.

Some advantageous embodiments may include additional components or other components in place of those illustrated in FIG. 3. Further, the different physical and functional components may be combined into a single component. In other embodiments, a single component may be implemented using multiple devices or systems.

Figure 4:
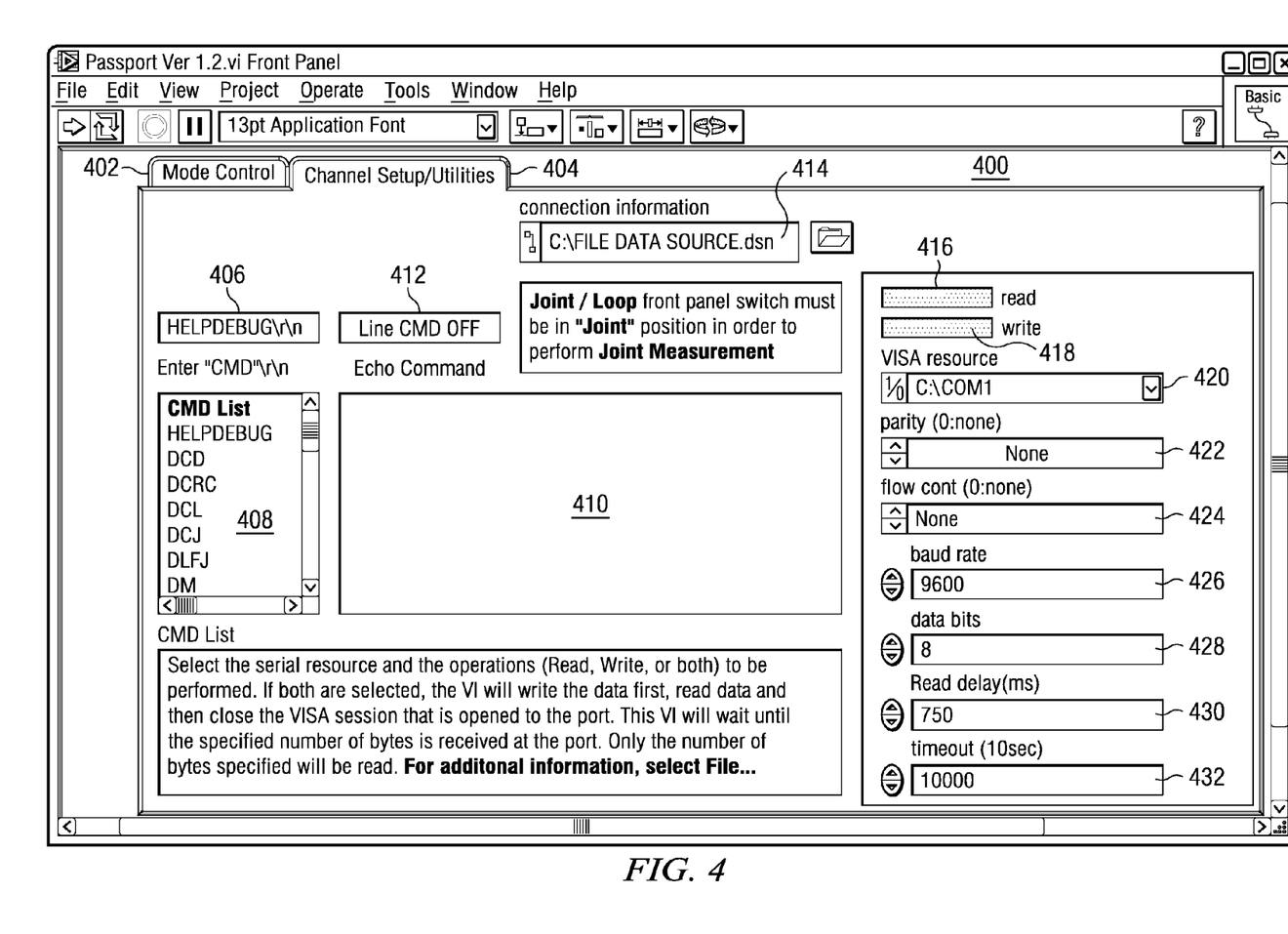
FIG. 4 is a diagram illustrating a graphical user interface in accordance with an advantageous embodiment.

With reference now to FIG. 4, a diagram illustrating a graphical user interface is depicted in accordance with an advantageous embodiment. In this example, display 400 is an example of a user interface that may be presented in graphical user interface 352 on display 332 in monitoring unit 304 in FIG. 3.

In this example, display 400 includes mode control tab 402 and channel setup/utilities tab 404. These tabs may be used to select different functions to interact with control program 342 in FIG. 3.

In this depicted example, channel setup/utilities tab 404 is the active tab. This interface may be used to select various operations to be performed by the loop resistance test unit. Commands may be entered in field 406. These commands may be typed into field 406 or may be selected from command list section 408. The execution of commands may be presented in section 410. Whether commands are echoed or displayed in section 410 may be selected in field 412. Field 414 allows a selection of a test point database. This database is the location to which different values may be exported and in which different values may be recorded or stored. Of course, in other advantageous embodiments, the measurements may be stored in a file or other data structure.

Indicator 416 indicates when data is being read from the loop resistance test unit. Indicator 418 indicates when commands are being written or sent to the loop resistance test unit. Field 420 allows a user to select a particular communications link and/or output device. Field 422 and field 424 are parameters for parity and flow control in a communications link. Field 426 identifies a rate at which data is to be exchanged. Field 428 identifies the number of bits that are to be exchanged. Field 430 may be used to manage data flow rates over a communications link, for example, a RS-232 wireless link. Field 432 may be used to set a timeout that indicates how long the system should wait for a response from a query.

Figure 5:
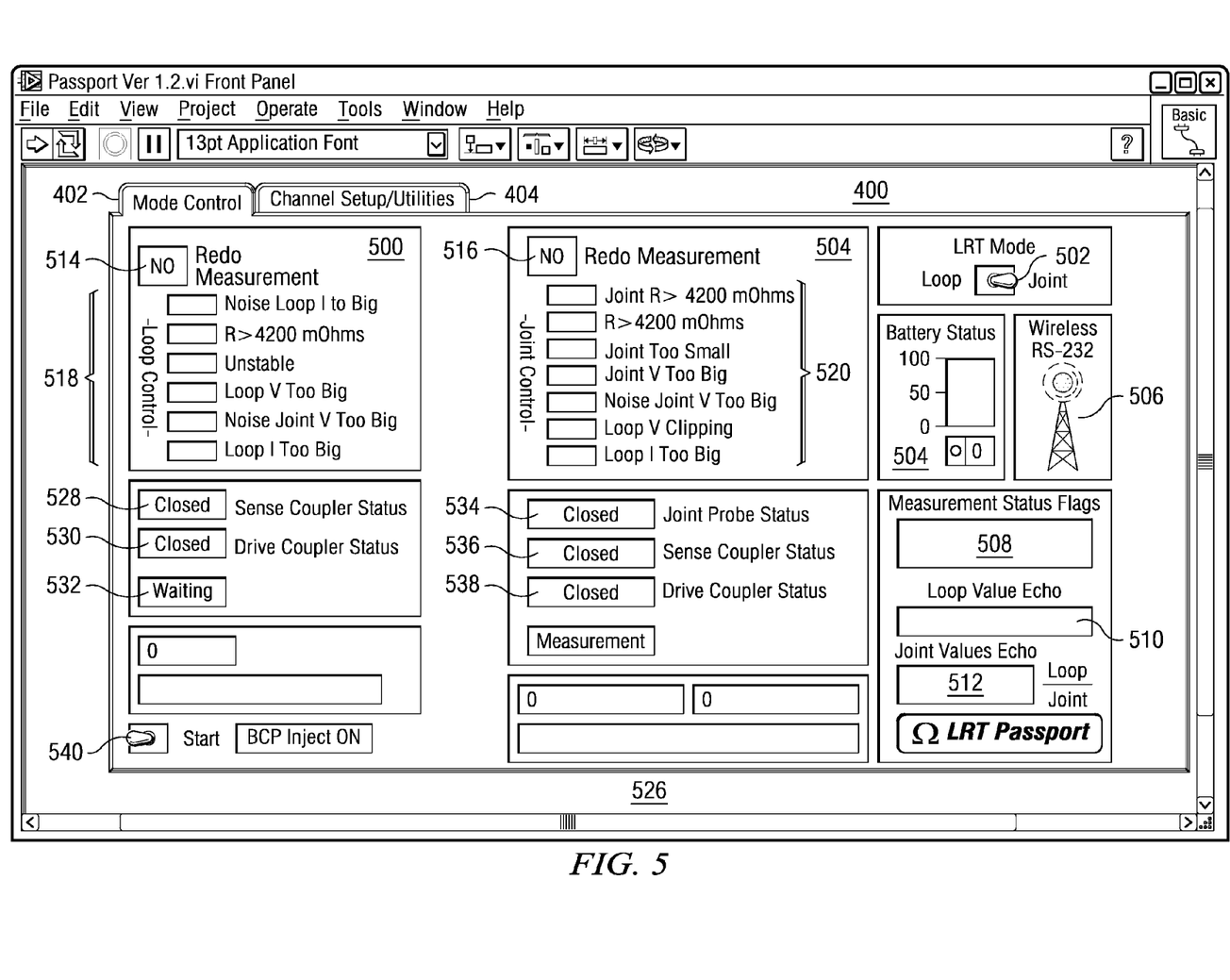
FIG. 5 is another diagram illustrating a graphical user interface in accordance with an advantageous embodiment.

With reference now to FIG. 5, another diagram illustrating a graphical user interface is depicted in accordance with an advantageous embodiment. In this example, mode control tab 402 is the active tab for display 400. In this example, section 500 identifies measurements made during a loop mode, while section 504 identifies measurements made during a joint mode. The type of measurements being made may be controlled. A user may use control 502 to select a loop mode or joint mode.

Section 505 identifies a battery status. Section 506 indicates whether a communications link is present. Measurement status flags may be displayed in section 508. In other advantageous embodiments, section 508 may be nonessential and may be absent. Loop measurement values may be echoed or presented in section 510. Joint measurement values may be presented or echoed in section 512.

In section 500, an indication of whether a loop measurement should be performed may be indicated by graphical indicator 514 in section 500. A similar indication may be made using graphical indicator 516 in section 504 for joint measurements. Various indications may be made during the measurements.

These measurements may be presented through indicators 518 for loop measurements. In a similar fashion, various indications may be made through indicators 520 in section 504 for joint measurement. For loop measurements, sense coupler status may be indicated in graphical indicator 522 while the status of a drive coupler may be indicated in graphical indicator 524. Section 526 indicates whether the operator is waiting for a next measurement.

The status of a joint probe, a sense coupler, and a drive coupler may be indicated in graphical indicators 528, 530, and 532, respectively, for joint measurements. The actual test may be initiated through the manipulation of control 534 in these examples.

Figure 6:
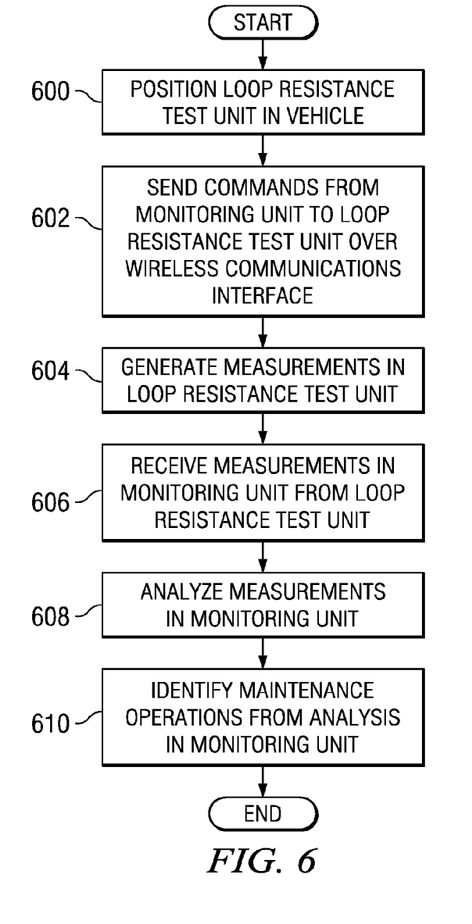
FIG. 6 is a flowchart of a process for remotely monitoring loop resistance in a vehicle in accordance with an advantageous embodiment.

With reference now to FIG. 6, a flowchart of a process for remotely monitoring loop resistance in a vehicle is depicted in accordance with an advantageous embodiment. The process illustrated in FIG. 6 may be implemented through a loop resistance test unit and a monitoring unit.

The process begins by positioning a loop resistance test unit in a structure (operation 600). In this example, a structure may be, for example, without limitation, an aircraft, a submarine, a spacecraft, a ship, a car, a tank, a power plant, a building, a space station, or any other suitable vehicle or structure. The process then sends commands from a monitoring unit to the loop resistance test unit over a wireless communications interface (operation 602).

The process generates measurements with the loop resistance test unit in response to the commands (operation 604). Then, the process receives measurements from the loop resistance test unit at the monitoring unit (operation 606). Next, the process analyzes the measurements received from the loop resistance unit by the monitoring unit to form an analysis (operation 608). The process then identifies maintenance operations from the analysis in the monitoring unit (operation 610), with the process terminating thereafter.

Figure 7:
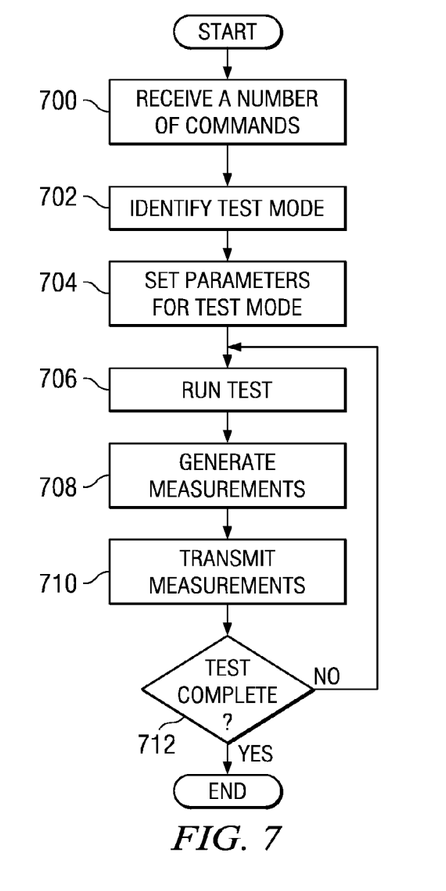
FIG. 7 is a flowchart of a process for performing loop resistance tests in accordance with an advantageous embodiment.

With reference now to FIG. 7, a flowchart of a process for performing loop resistance tests is depicted in accordance with an advantageous embodiment. The process illustrated in FIG. 7 may be implemented in a controller, such as, for example, controller 318 in loop resistance test unit 302 in FIG. 3.

The process begins by receiving a number of commands (operation 700). The set of commands may be received through a wireless medium from a wireless communications unit in a monitoring unit in a remote location. The set of commands may include an identification of tests as well as parameters or values to be used in the tests.

The process then identifies a test mode to be performed from the received commands (operation 702). In operation 702, the type of test mode selected may be a joint test mode or a loop test mode. Other tests may not be selectable depending on the particular type of implementation. In these examples, the tests may be a loop resistance test for shielded cables or a joint impedance test for joints to which a cable is connected.

The process then sets parameters for the test mode based on the commands received in operation 700 (operation 704). Next, the process runs the test (operation 706). In operation 706, the process has two automatic initiation states. If in joint test mode, the process monitors the two joint probes. Via sense current circuitry in the test unit, the test unit recognizes that the joint probes are being applied and begins the measurement. These measurements will continue to be taken until the joint probes are no longer applied to the shielded cable.

If the test unit is in loop test mode, the technician manually activates a start switch located on one of the coupler cables to begin the measurement in these examples. However, this step is wirelessly removed from the technician so the only interaction the technician has during any measurement is with the person monitoring the remote software for the data, flags, and/or instructions for where and what to measure next. It is the remote operator who remotely activates the start switch using the graphical user interface.

While the test runs, the process generates measurements (operation 708). The process then transmits these measurements to the monitoring unit in response to automated querying from the remote monitoring unit (operation 710). Next, the process makes a determination as to whether the test is complete (operation 712). If the test is not complete, the process returns to operation 706.

In this example, a test may be incomplete if additional or repeated measurements are to be made. However, a test may be complete if no additional measurements are needed and/or if a change in a test mode parameter occurs. For example, without limitation, if the test mode is loop test mode, a test may be complete if the test mode has been changed to joint test mode and/or if the current couplers have been disconnected from the shielded cables.

Further, if the test mode is joint test mode, the test may be complete if the joint probes have been removed from contact with the shielded cables. In other advantageous embodiments, other criteria for determining whether a test is complete or incomplete may be used. If the test is complete, the process terminates.

In some advantageous embodiments, the different operations illustrated in FIG. 7 may be executed in other sequences or some operations may be added or removed. For example, operation 710 may occur concurrently with operation 708. In this manner, measurements are transmitted while the test is being performed.

Figure 8:
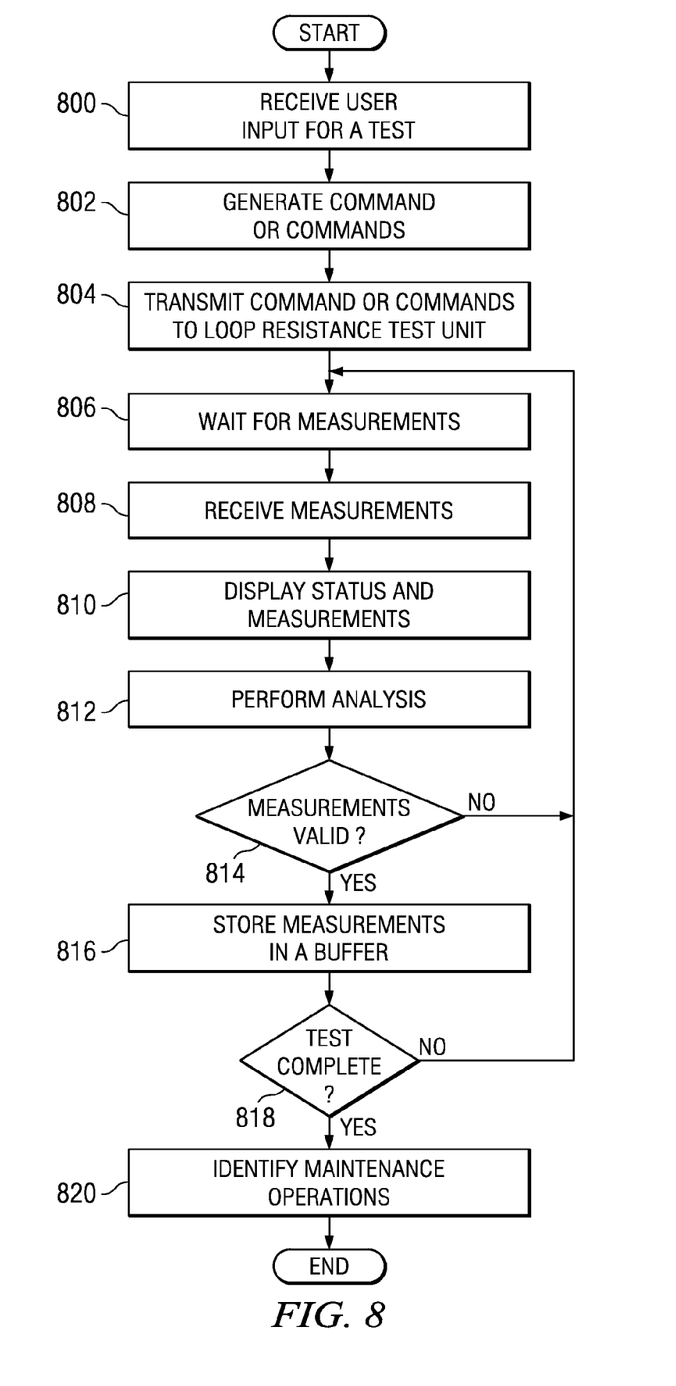
FIG. 8 is a flowchart of a process for performing a loop resistance test in accordance with an advantageous embodiment.

With reference now to FIG. 8, a flowchart of a process for performing a loop resistance test is depicted in accordance with an advantageous embodiment. The process illustrated in FIG. 8 may be implemented in a component such as monitoring unit 304 in FIG. 3. In particular, these different operations may be implemented in control program 342 in FIG. 3.

The process begins by receiving user input for a test (operation 800). The process may receive user input through a graphical user interface such as that shown in display 400 in FIG. 4. The process then generates a command or commands for a test (operation 802). The process then transmits the command or commands to the loop resistance test unit (operation 804).

The process then waits for measurements to be received from the loop resistance test unit (operation 806). The process receives measurements from the loop resistance test unit (operation 808). The process then displays the status and measurements (operation 810). The process performs an analysis of the measurements (operation 812).

A determination is then made as to whether the measurements are valid (operation 814). If the measurements are valid, the process then stores the measurements that have been received in a buffer (operation 816). If the measurements are not valid, the measurements are not stored in the buffer and the process returns to operation 806 to wait for repeated measurements. A determination is made as to whether the test is complete (operation 818).

If the test is not complete, the process returns to operation 806 to wait for additional measurements. If the test is complete, the process may then identify maintenance operations (operation 820), with the process terminating thereafter.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

Thus, the different advantageous embodiments provide a computer implemented method, apparatus, and computer program code for remotely monitoring loop resistance in a vehicle. A loop resistance test unit is positioned in a vehicle. A set of commands is sent from a monitoring unit to the loop resistance test unit over a wireless communications interface. Measurements are generated within the loop resistance test unit in response to the set of commands. The measurements are received from the loop resistance test unit at the monitoring unit in response to the set of commands sent over the wireless communications interface.

The different advantageous embodiments may be used to reduce the time and expense that is currently encountered when testing electrical systems in an aircraft. The different advantageous embodiments may provide a capability to obtain measurements more quickly and efficiently. Although the illustrative examples are directed towards an aircraft, the different advantageous embodiments may be applied to other types of vehicles. For example, the different advantageous embodiments may be used to make measurements in a submarine, a spacecraft, a tank, a ship, or a truck. Further, the different advantageous embodiments may be applied to other objects with electrical systems, such as, for example, a power plant, building, or some other suitable object.

The different advantageous embodiments can take the form of an entirely hardware embodiment, an entirely software embodiment, or an embodiment containing both hardware and software elements. Some embodiments are implemented in software, which includes, but is not limited to forms, such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation, an electronic, magnetic, optical, electromagnetic, infrared, or semiconductor system, or a propagation medium. Non-limiting examples of a computer-readable medium include a semiconductor or solid state memory, magnetic tape, removable computer diskette, random access memory (RAM), read-only memory (ROM), rigid magnetic disk, and optical disk. Optical disks may include compact disk-read only memory (CD-ROM), compact disk-read/write (CD-R/W), and DVD.

Further, a computer usable or computer readable medium may contain or store a computer readable or usable program code, such that when the computer readable or usable program code is executed on a computer, the execution of this computer readable or usable program code causes the computer to transmit another computer readable or usable program code over a communications link. This communications link may use a medium that is, for example, without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and/or cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters also may be coupled to the system to enable the data processing system to become coupled to other data processing systems, remote printers, storage devices through intervening private or public networks. Non-limiting examples, such as modems and network adapters, are just a few of the currently available types of communications adapters. The description of the different advantageous embodiments has been presented for purposes of illustration and description, and is not intended to be exhaustive or limited to the embodiments in the form disclosed. Many modifications and variations will be apparent to those of ordinary skill in the art. The different advantageous embodiments may be applied to a number of different environments other than aircraft.

For example, the different advantageous embodiments may be used in other structures. These structures include, for example, surface ships, spacecraft, submarines, armored personnel carriers, tanks, trucks, automobiles, manufacturing facilities, power plants, or any other suitable structure. In other advantageous embodiments, a loop resistance test unit may include processes to preprocess data for analysis. For example, the loop resistance test may determine whether data is valid before sending the data to the monitoring unit.

Further, different advantageous embodiments may provide different advantages as compared to other advantageous embodiments. The embodiment or embodiments selected are chosen and described in order to best explain the principles of the embodiments and the practical application, and to enable others of ordinary skill in the art to understand this disclosure for various embodiments with various modifications as are suited to the particular uses contemplated.

What is claimed is:

1. A method for remotely monitoring loop resistance in a structure, the method comprising:
    positioning a loop resistance test unit in the structure;
    sending a set of commands from a monitoring unit to the loop resistance test unit over a wireless communications interface;
    generating measurements with the loop resistance test unit in response to the set of commands; and
    receiving the measurements from the loop resistance test unit at the monitoring unit in response to the set of commands send over the wireless communications interface.

2. The method of claim 1 further comprising:
    analyzing the measurements received from the loop resistance test unit by the monitoring unit to form an analysis.

3. The method of claim 2 further comprising:
    identifying maintenance operations from the analysis.

4. The method of claim 1 further comprising:
    receiving user input through a graphical user interface to generate the set of commands.

5. The method of claim 4, wherein the set of commands is for at least one of a loop measurement and a joint measurement.

6. The method of claim 1 further comprising:
    displaying the measurements on a display device in the monitoring unit as the measurements are received from the loop resistance test unit.

7. The method of claim 1 further comprising:
    sending the measurements from the loop resistance test unit as the measurements are being made.

8. The method of claim 1, wherein the structure is selected from one of an aircraft, a submarine, a spacecraft, a ship, a car, a tank, a power plant, a space station, and a building.

9. An apparatus comprising:
    a loop resistance test unit having a first wireless communications unit, wherein the loop resistance test unit is capable of receiving a set of commands over the first wireless communications unit, executing a number of tests using the set of commands, generating measurements from executing the set of tests, and sending the measurements using the first wireless communications unit; and
    a monitoring unit having a second wireless communications unit, wherein the monitoring unit is capable of generating the set of commands in response to a user input, sending the set of commands to the loop resistance test unit over the second wireless communications unit, and receiving the measurements sent by the first wireless communications over the second communications unit.

10. The apparatus of claim 9, wherein the monitoring unit displays a graphical user interface on a display device to receive the user input.

11. The apparatus of claim 10, wherein the monitoring unit displays the measurements on the graphical user interface as the measurements are received by the monitoring unit.

12. The apparatus of claim 9, wherein the monitoring unit stores the measurements and performs an analysis on the measurements.

13. The apparatus of claim 9, wherein the loop resistance test unit is capable of generating the measurements from at least one of a loop test mode and a joint test mode.

14. The apparatus of claim 9, wherein the loop resistance test unit includes a sense coupler, a drive current coupler, and a number of joint probes.

15. A computer program product for loop resistance testing, the computer program product comprising:
    a computer readable storage medium;
    program code, stored on the computer readable medium, for generating a set of commands to cause a loop resistance test unit to perform a set of tests;
    program code, stored on the computer readable medium, for sending the set of commands to the loop resistance test unit over a wireless interface; and
    program code, stored on the computer readable medium, for receiving measurements sent by the loop resistance test unit from performing the set of tests wherein the measurements are received over the wireless interface.

16. The computer program product of claim 15 further comprising:
    program code, stored on the computer readable medium, to display a graphical user interface to receive user input to generate the set of commands.

17. The computer program product of claim 15 further comprising:
    program code, stored on the computer readable medium, for displaying the measurements received over the wireless interface.

18. The computer program product of claim 15 further comprising:
    program code, stored on the computer readable medium, for receiving the measurements as the measurements are generated from performing the set of tests.

19. The computer program product of claim 15 further comprising:
    program code, stored on the computer readable medium, for displaying a graphical user interface having a command generation screen and a status screen.

20. The computer program product of claim 15, wherein the set of commands is for at least one of a loop test and a joint test.

* * * * *